(12) United States Patent
Eckert et al.

(10) Patent No.: US 10,263,165 B2
(45) Date of Patent: Apr. 16, 2019

(54) OPTOELECTRONIC COMPONENT WITH OPTICAL ELEMENTS FOR BEAM SHAPING AND BEAM DEFLECTION

(71) Applicant: OSRAM Opto Semiconductors GmbH, Regensburg (DE)

(72) Inventors: Tilman Eckert, Penang (MY); Claus Jäger, Regensburg (DE); Ee Lian Lee, Balik Pulau (MY); Michael Hirmer, Wiesent (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 114 days.

(21) Appl. No.: 15/543,180

(22) PCT Filed: Jan. 12, 2016

(86) PCT No.: PCT/EP2016/050462
§ 371 (c)(1),
(2) Date: Jul. 12, 2017

(87) PCT Pub. No.: WO2016/113248
PCT Pub. Date: Jul. 21, 2016

(65) Prior Publication Data
US 2018/0026167 A1    Jan. 25, 2018

(30) Foreign Application Priority Data

Jan. 12, 2015  (DE) .................. 10 2015 100 329

(51) Int. Cl.
*H01L 33/58* (2010.01)
*H01L 33/60* (2010.01)
*H01L 33/48* (2010.01)

(52) U.S. Cl.
CPC ............ *H01L 33/58* (2013.01); *H01L 33/486* (2013.01); *H01L 33/60* (2013.01)

(58) Field of Classification Search
CPC ........ H01L 33/58; H01L 33/60; H01L 33/486
See application file for complete search history.

(56) References Cited

U.S. PATENT DOCUMENTS

| 8,517,571 B2 | 8/2013 | Kayanuma |
| 9,466,773 B2 | 10/2016 | Steppel et al. |
| 2004/0170018 A1 | 9/2004 | Nawashiro |
| 2005/0024746 A1 | 2/2005 | Shimura |
| 2005/0243570 A1 | 11/2005 | Chaves et al. |

(Continued)

FOREIGN PATENT DOCUMENTS

| DE | 102011002483 A1 | 7/2011 |
| DE | 102010012712 A1 | 9/2011 |

(Continued)

*Primary Examiner* — Andrew Q Tran
(74) *Attorney, Agent, or Firm* — Slater Matsil, LLP (57) ABSTRACT

In an embodiment the optical component includes an optoelectronic semiconductor chip including a radiation emission face, a deflection element configured to deflect electromagnetic radiation emitted by the optoelectronic semiconductor chip in a main emission direction which forms an angle deviating from 90° with the radiation emission face, wherein the deflection element is configured as a prism structure and an optical lens having an optical axis, wherein the optical axis forms an angle deviating from 90° with the radiation emission face.

14 Claims, 8 Drawing Sheets

(56) References Cited

U.S. PATENT DOCUMENTS

| | | |
|---|---|---|
| 2008/0106910 A1 | 5/2008 | Bollea et al. |
| 2011/0103070 A1 | 5/2011 | Zhang et al. |
| 2015/0155270 A1* | 6/2015 | Rossi .................... G02B 7/021 |
| | | 362/237 |
| 2017/0331015 A1* | 11/2017 | Hirmer ................... H01L 33/58 |
| 2018/0026167 A1* | 1/2018 | Eckert .................... H01L 33/58 |

FOREIGN PATENT DOCUMENTS

| | | | |
|---|---|---|---|
| DE | 102011084881 A1 | 4/2013 | |
| DE | 102015100329 | * 7/2016 | ............. H01L 33/58 |

\* cited by examiner

FIG 8

OPTOELECTRONIC COMPONENT WITH OPTICAL ELEMENTS FOR BEAM SHAPING AND BEAM DEFLECTION

This patent application is a national phase filing under section 371 of PCT/EP2016/050462, filed Jan. 12, 2016, which claims the priority of German patent application 10 2015 100 329.5, filed Jan. 12, 2015, each of which is incorporated herein by reference in its entirety.

TECHNICAL FIELD

The present patent application relates to an optoelectronic component according to patent claim 1.

It is known to equip optoelectronic components, for example, light emitting diode components, with optical elements for beam shaping and/or deflection. By way of example, optical lenses are known for beam shaping. By way of example, prism structures are known for beam deflection.

SUMMARY OF THE INVENTION

Embodiments of the invention provide an optoelectronic component.

In various embodiments the optoelectronic component comprises an optoelectronic semiconductor chip comprising a radiation emission face, a deflection element configured to deflect electromagnetic radiation emitted by the optoelectronic semiconductor chip in a main emission direction which forms an angle deviating from 90° with the radiation emission face, and an optical lens, the optical axis of which forms an angle deviating from 90° with the radiation emission face.

The deflection of the emitted electromagnetic radiation in the main emission direction, which deflection is brought about by the deflection element of this optoelectronic component, makes it possible, with this optoelectronic component, to illuminate a spatial or areal region which is arranged at an angle deviating from 90° with respect to the radiation emission face of the optoelectronic semiconductor chip of the optoelectronic component, that is to say is situated in an oblique direction in front of the optoelectronic component. In this case, the optical lens of the optoelectronic component makes it possible to focus electromagnetic radiation emitted by the optoelectronic semiconductor chip in the direction of the spatial or areal region to be illuminated by the optoelectronic component. In this case, a substantially symmetrical beam profile may be generated with the optical lens of this optoelectronic component in an imaging plane.

In one embodiment of the optoelectronic component, the optical lens is configured as a converging lens. As a result, the optical lens of the optoelectronic component may bring about a focusing of electromagnetic radiation emitted by the optoelectronic component.

In one embodiment of the optoelectronic component, the optical lens is configured in a non-radially symmetrical fashion. What is achieved as a result is that the optical lens comprises non-radially symmetrical optical imaging properties.

In one embodiment of the optoelectronic component, the optical lens comprises the shape of an ellipse in a plane parallel to the radiation emission face. This advantageously makes it possible to configure the optical lens with an optical axis which is oriented at an angle deviating from 90° with respect to the radiation emission face of the optoelectronic semiconductor chip of the optoelectronic component.

In one embodiment of the optoelectronic component, the optical axis of the optical lens and the major axis of the ellipse are arranged in a common plane. What may advantageously be achieved as a result is that the optical lens comprises a mirror symmetry with respect to said plane.

In one embodiment of the optoelectronic component, the main emission direction and the optical axis of the optical lens are arranged in a common plane. This makes it possible to ensure that the beam shaping—brought about by the optical lens—of the electromagnetic radiation deflected in the main emission direction by the deflection element brings about only little corruption of a beam profile. In particular, what may be achieved as a result is that a beam of rays that is deflected in the main emission direction by the deflection element of the optoelectronic component and is shaped by the optical lens of the optoelectronic component comprises a substantially radially symmetrical beam profile.

In one embodiment of the optoelectronic component, the main emission direction and the optical axis are tilted in the same direction relative to a direction perpendicular to the radiation emission face. In this case, the main emission direction and the optical axis may be tilted by similar or identical angles relative to a direction oriented perpendicular to the radiation emission face of the optoelectronic semiconductor chip. Advantageously, the optoelectronic component thereby makes it possible to generate a beam of rays directed in the main emission direction with a substantially radially symmetrical beam profile.

In one embodiment of the optoelectronic component, the deflection element is configured as a prism structure. In this case, the prism structure may comprise one or a plurality of individual prisms. A deflection element configured as a prism structure advantageously enables an effective beam deflection with only minor optical losses.

In one embodiment of the optoelectronic component, the optical lens and the prism structure are formed on a common optical element. This advantageously results in a particularly simple construction of the optoelectronic component with only a small number of individual component parts. This enables cost-effective production and mounting of the optoelectronic component.

In one embodiment of the optoelectronic component, the prism structure and the optical lens are superimposed on one another. This may be achieved by the prism structure and the optical lens being arranged on a common side of the optical element. This is advantageously made possible by forming an opposite side of the optical element with a substantially planer surface, as a result of which the handling and mounting of the optical element and also of the optoelectronic component equipped with the optical element may be simplified.

In one embodiment of the optoelectronic component, the optical element is configured as a total internal reflection lens. This makes it possible to configure the optoelectronic component with particularly compact external dimensions.

In one embodiment of the optoelectronic component, the prism structure and the optical lens are formed on opposite sides of the optical element. This advantageously makes it possible to manufacture the prism structure and the optical lens with particularly high accuracy in each case.

In one embodiment of the optoelectronic component, the deflection element is configured as a reflector. As a result, the deflection element may advantageously be manufactured particularly simply, cost-effectively and with high accuracy.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings. Here in each case in a schematic illustration.

DETAILED DESCRIPTION OF ILLUSTRATIVE EMBODIMENTS

Figure 1:
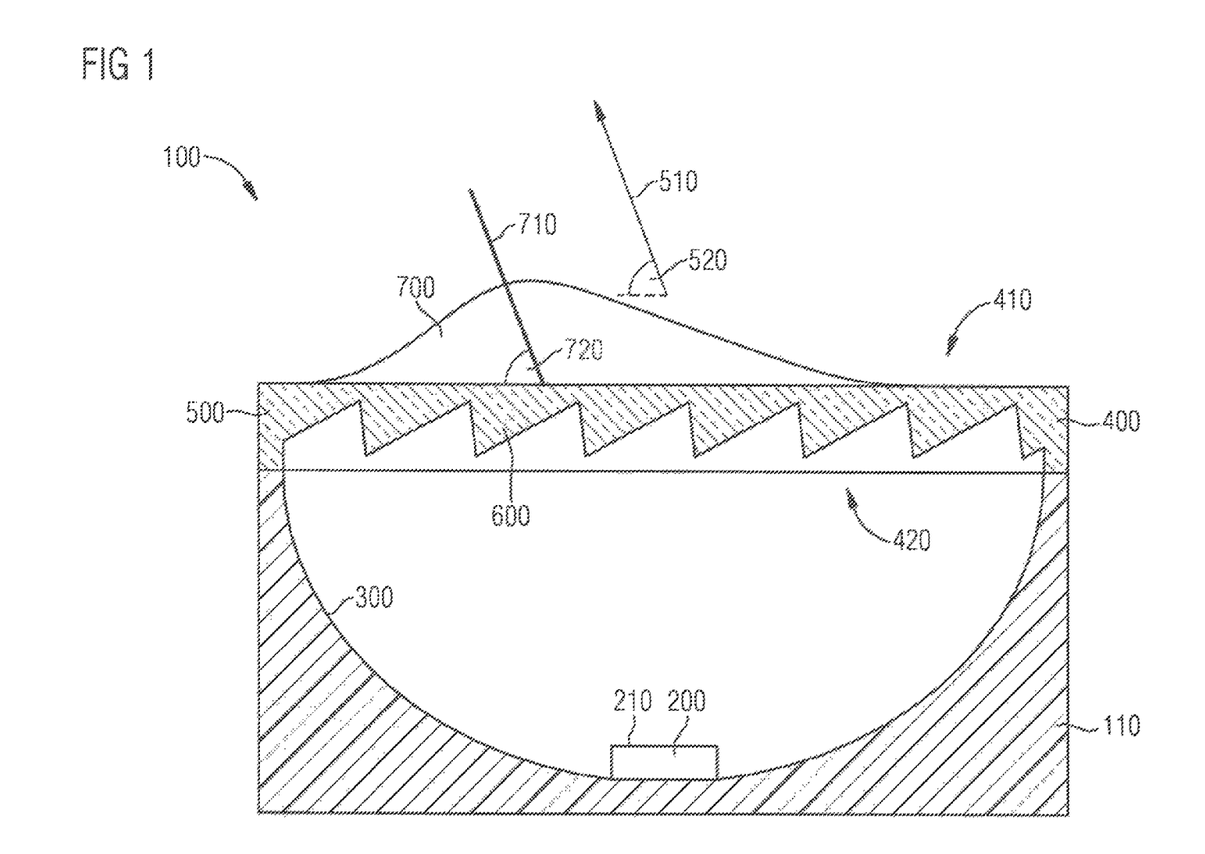
FIG. 1 shows a sectional side view of a first optoelectronic component.

FIG. 1 shows a schematic sectional side view of a first optoelectronic component 100. The first optoelectronic component 100 is configured to emit electromagnetic radiation, for example, visible light or light having a wavelength from the infrared spectral range. The first optoelectronic component 100 may be, for example, a light emitting diode component part (LED component part). The first optoelectronic component 100 is configured to emit electromagnetic radiation non-centrally, that is to say in an oblique direction.

The first optoelectronic component 100 comprises a housing 110. The housing 110 may comprise, for example, a plastics material, in particular, for example, an epoxy resin. The housing 110 may be produced, for example, by means of a molding method (mold method).

The housing 110 of the first optoelectronic component 100 comprises a cavity that forms a first reflector 300 configured as a concave mirror. The first reflector 300 may comprise the shape of a paraboloid of revolution, a spherical shape or some other shape. In this case, the first reflector 300 is configured in a rotationally symmetrical fashion (in a radially symmetrical fashion) with respect to an axis of symmetry. That wall of the housing 110 which forms the first reflector 300 is optically reflective. For this purpose, the housing 110 of the first optoelectronic component 100 may comprise, for example, a white material. That wall of the housing 110 which forms the first reflector 300 may also comprise a metallization in order to increase the reflectivity of that wall of the housing 110 which forms the first reflector 300.

An optoelectronic semiconductor chip 200 is arranged in the cavity of the housing 110 of the first optoelectronic component 100, said cavity forming the first reflector 300. The optoelectronic semiconductor chip 200 comprises a radiation emission face 210 oriented perpendicularly to the axis of symmetry of the first reflector 300. The optoelectronic semiconductor chip 200 is configured to emit electromagnetic radiation, for example, visible light or light having a wavelength from the infrared spectral range, at its radiation emission face 210. The optoelectronic semiconductor chip 200 may be, for example, a light emitting diode chip (LED chip). The electromagnetic radiation emitted at the radiation emission face 210 is emitted at a solid angle centered around a direction oriented perpendicularly to the radiation emission face 210.

The first reflector 300 of the optoelectronic component 100 is provided for collecting electromagnetic radiation emitted by the optoelectronic semiconductor chip 200 at the radiation emission face 210. For this purpose, the optoelectronic semiconductor chip 200 is arranged at the bottom region of the cavity of the housing 110, said cavity forming the first reflector 300. Electromagnetic radiation emitted by the optoelectronic semiconductor chip 200 is guided to the outer opening of the first reflector 300 by the first reflector 300.

The first optoelectronic component 100 comprises a first optical element 400. The first optical element 400 is arranged at the outer opening of the first reflector 300 and covers the outer opening of the first reflector 300. The first optical element 400 comprises a top side 410 and an underside 420 opposite the top side 410. The underside 420 of the first optical element 400 faces the radiation emission face 210 of the optoelectronic component 200.

Figure 2:
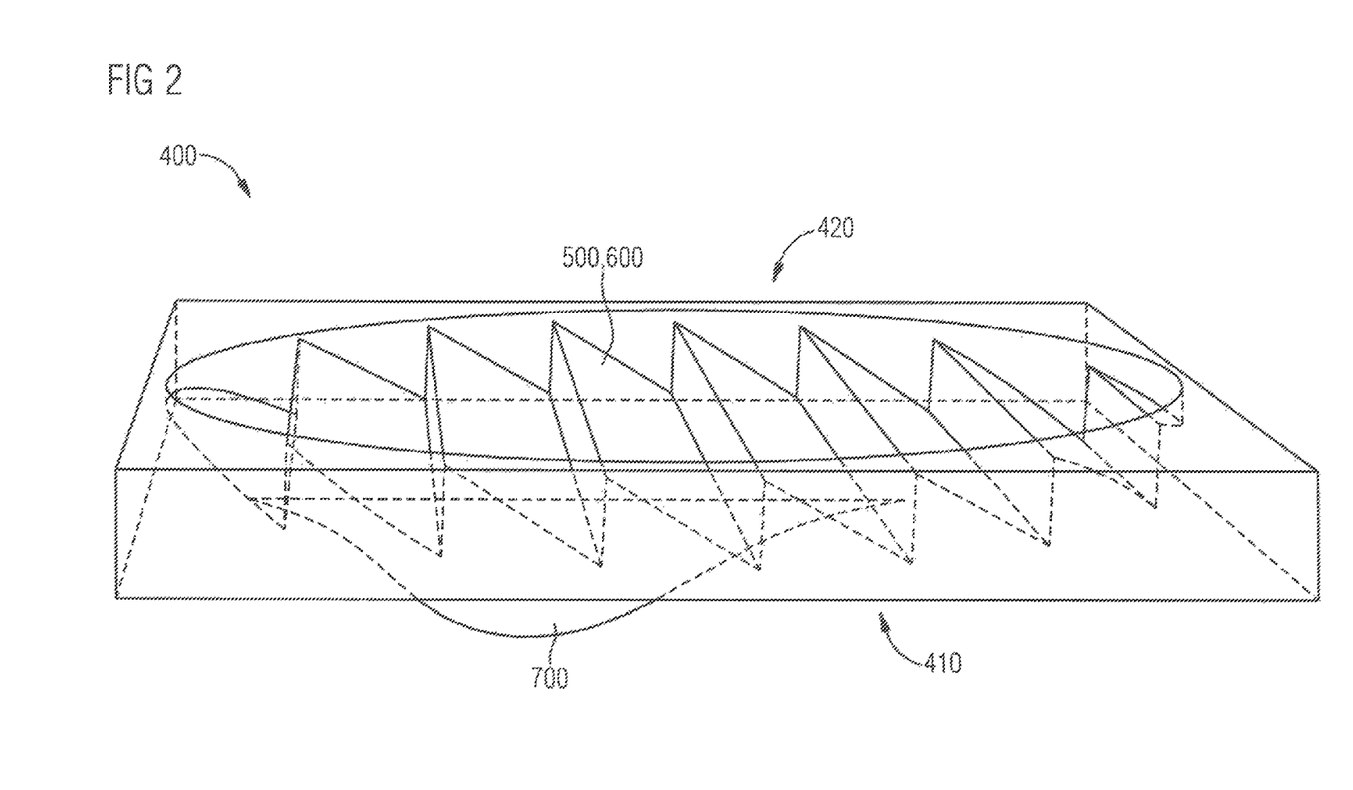
FIG. 2 shows a perspective view of a first optical element of the first optoelectronic component.
Figure 3:
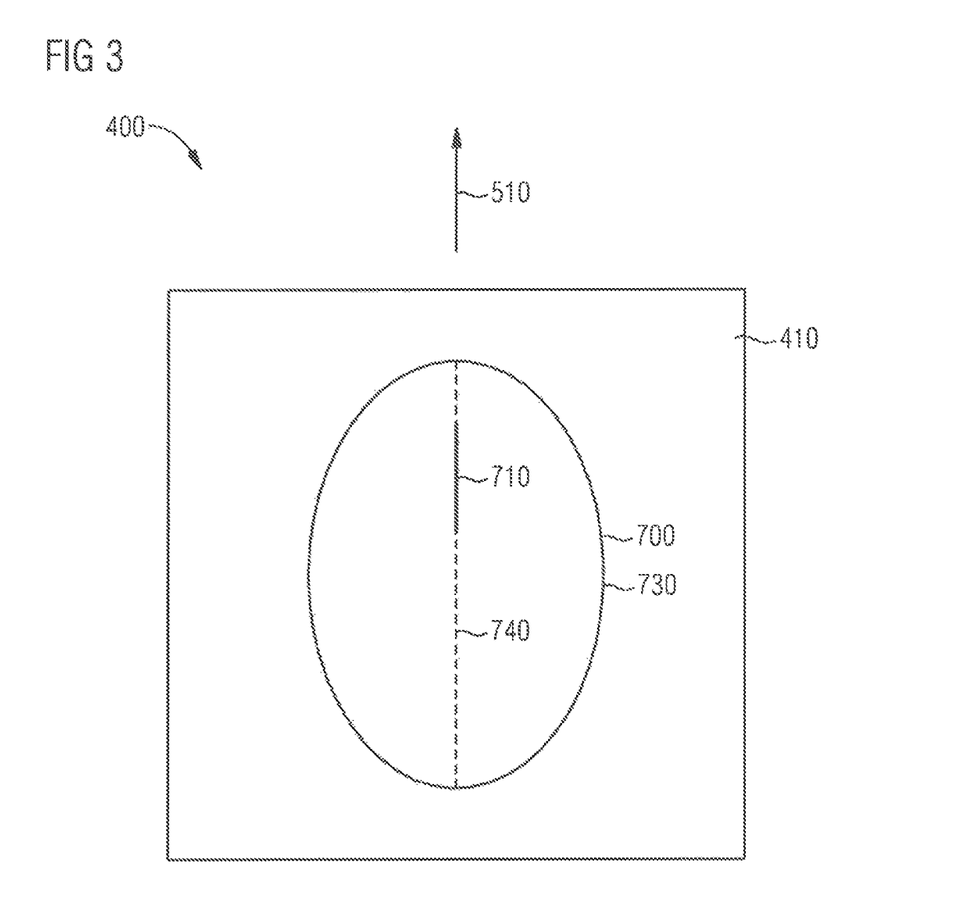
FIG. 3 shows a plan view of the first optical element.

FIG. 2 shows a schematic and partly transparent perspective illustration of the first optical element 400. FIG. 3 shows a schematic plane view of the top side 410 of the first optical element 400.

The first optical element 400 comprises an optically transparent material, for example, a glass or an optically transparent plastic.

At the underside 420, the first optical element 400 of the first optoelectronic component 100 comprises a first prism structure 600. The first prism structure 600 is formed by a sawtooth-shaped modulation of the surface of the first optical element 400 at the underside 420 of the first optical element 400. In this case, the first prism structure 600 comprises a plurality of prisms each having a sawtooth-shaped cross section, said prisms being oriented parallel to one another. The number of individual prisms of the first prism structure 600 may be chosen as desired. The first prism structure 600 may even comprise only a single prism.

The first prism structure 600 at the underside 420 of the first optical element 400 is delimited by a ring-shaped edge provided for securing the first optical element 400 on a top side of the housing 110 above the first reflector 300. In this case, the first optical element 400 is secured on the housing 110 in such a way that the first prism structure 600 on the underside 420 of the first optical element 400 is arranged above the opening of the first reflector 300 and faces the radiation emission face 210 of the optoelectronic semiconductor chip 200.

The first prism structure 600 on the underside 420 of the first optical element 400 forms a first deflection element 500. The first deflection element 500 is configured to deflect the electromagnetic radiation emitted by the optoelectronic semiconductor chip 200 and guided to the first deflection element 500 by the first reflector 300 in a main emission direction 510. The main emission direction 510 is not oriented perpendicularly to the radiation emission face 210 of the optoelectronic semiconductor chip 200, but rather forms an angle 520 deviating from 90° with the radiation emission face 210 of the optoelectronic semiconductor chip 200.

A first optical lens 700 is formed on the top side 410 of the first optical element 400 of the first optoelectronic component 100. The first prism structure 600 and the first optical lens 700 are thus formed integrally continuously on mutually opposite sides 410, 420 of the first optical element 400. The first optical lens 700 is configured as a convex converging lens and serves to focus the electromagnetic radiation deflected in the main emission direction 510 by the first deflection element 500.

The first optical lens 700 comprises an optical axis 710, which is not oriented perpendicularly to the radiation emission face 210 of the optoelectronic semiconductor chip 200, but rather forms an angle 720 deviating from 90° with the radiation emission face 210 of the optoelectronic semiconductor chip 200. The optical axis 710 of the first optical lens 700 and the main emission direction 510 are arranged in a common plane and tilted relative to a direction perpendicular to the radiation emission face 210 of the optoelectronic semiconductor chip 200 in the same direction. This is discernible in FIGS. 1 and 3.

The first optical lens 700 of the first optoelectronic component 100 is configured in a non-radially symmetrical fashion. In the plan view in FIG. 3 it is evident that the first optical lens 700 in projection perpendicular to the radiation emission face 210 of the optoelectronic semiconductor chip 200 and also in section in a plane parallel to the radiation emission face 210 comprises an outer contour in the form of an ellipse 730. In this case, the major axis 740 of said ellipse 730 is arranged in a common plane with the optical axis 710 of the first optical lens 700. The major axis 740 of the ellipse 730 is thus also arranged in a common plane with the main emission direction 510 of the first deflection element 500 of the first optoelectronic component 100.

Electromagnetic radiation emitted at the radiation emission face 210 of the optoelectronic semiconductor chip 200 of the first optoelectronic component 100 impinges on the first optical element 400 at the outer opening of the first reflector 300 of the first optoelectronic component 100 and passes through the first optical element 400. In this case, the electromagnetic radiation is deflected by the first deflection element 500 of the first optical elements 400, said first deflection element being formed by the first prism structure 600, in the main emission direction 510 and is focused by the first optical lens 710 of the first optical element 400.

Figure 4:
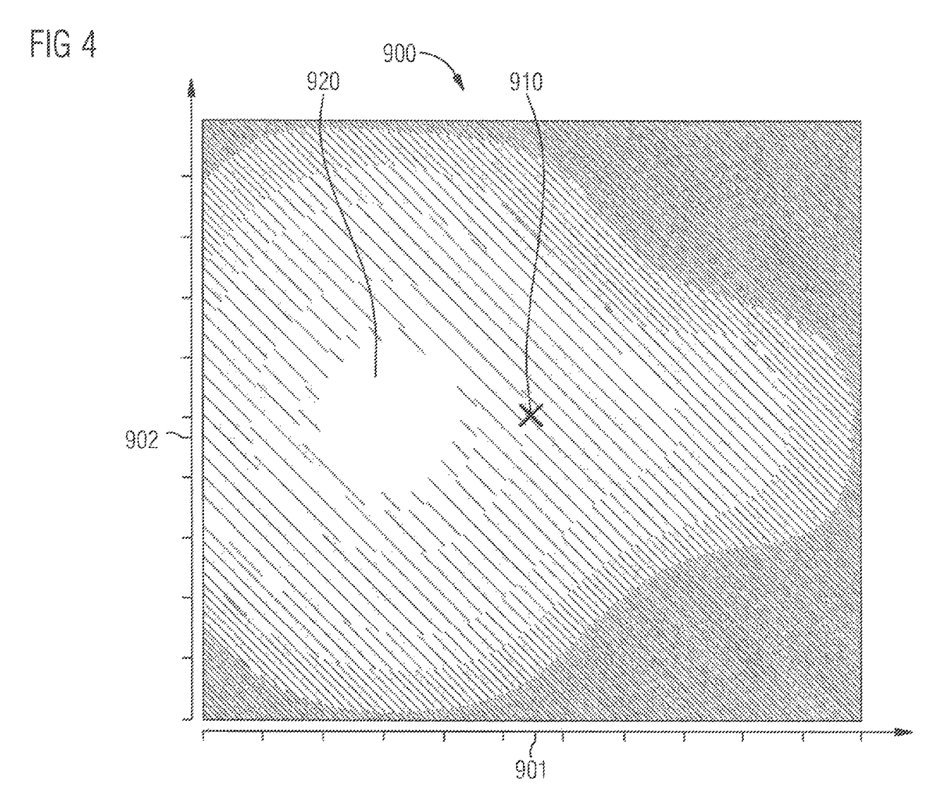
FIG. 4 shows an irradiation intensity diagram.

FIG. 4 shows a schematic irradiation intensity diagram 900 that indicates an irradiation intensity in an area which is illuminated by the first optoelectronic component 100 and which is oriented parallel to the radiation emission face 210 of the optoelectronic semiconductor chip 200 of the first optoelectronic component 100 and, in a manner spaced apart from the first optoelectronic component 100, is arranged above the top side 410 of the first optical element 400 of the first optoelectronic component 100. A first spatial direction 910 is oriented parallel to a projection of the main emission direction 510 onto the radiation emission face 210 of the optoelectronic semiconductor chip 200. A second spatial direction 902 is oriented perpendicularly to the first spatial direction 901 and parallel to the radiation emission face 210 of the optoelectronic semiconductor chip 200. A midpoint 910 of the area shown in the irradiation intensity diagram 900 is arranged above a midpoint of the radiation emission face 210 in a direction perpendicular to the radiation emission face 210 of the optoelectronic semiconductor chip 200.

The irradiation intensity in the area illuminated by the first optoelectronic component 100, which irradiation intensity is shown in the irradiation intensity diagram 900, comprises an intensity maximum 920 that is shifted in the first spatial direction 901 relative to the midpoint 910. The illumination of the area represented in the irradiation intensity diagram 900 by the first optoelectronic component 100 is therefore not configured centrally around the midpoint 910. The reason for this is that the light emitted by the optoelectronic semiconductor chip 200 is emitted by the first optoelectronic component 100 in the main emission direction 510 obliquely with respect to the intensity maximum 920.

The irradiation intensity in the area illuminated by the first optoelectronic component 100, which irradiation intensity is illustrated in the irradiation intensity diagram 900, is substantially radially symmetrical about the intensity maximum 920. This is achieved by virtue of the fact that the optical axis 710 of the first optical lens 700 forms the angle 720 deviating from 90° with the radiation emission face 210 of the optoelectronic semiconductor chip 200, wherein the angle 720 is coordinated with the angle 520 that the main emission direction 510 forms with the radiation emission face 210 of the optoelectronic semiconductor chip 200. The angle 720 of the optical axis 710 and the angle 520 of the main emission direction 510 may comprise similar values.

Further optoelectronic components are described below with reference to FIGS. 5 to 8, which further optoelectronic components comprise in each case great correspondences with the first optoelectronic component 100 in FIG. 1. In this case, in FIGS. 5 to 8, corresponding component parts are provided in part with the same reference signs as in FIGS. 1 to 3. Substantially only the differences between the optoelectronic components illustrated in FIGS. 5 to 8 and the first optoelectronic component 100 in FIG. 1 are explained below. For the rest, the above description of the first optoelectronic component 100 is also applicable to the optoelectronic components shown in FIGS. 5 to 8.

Figure 5:
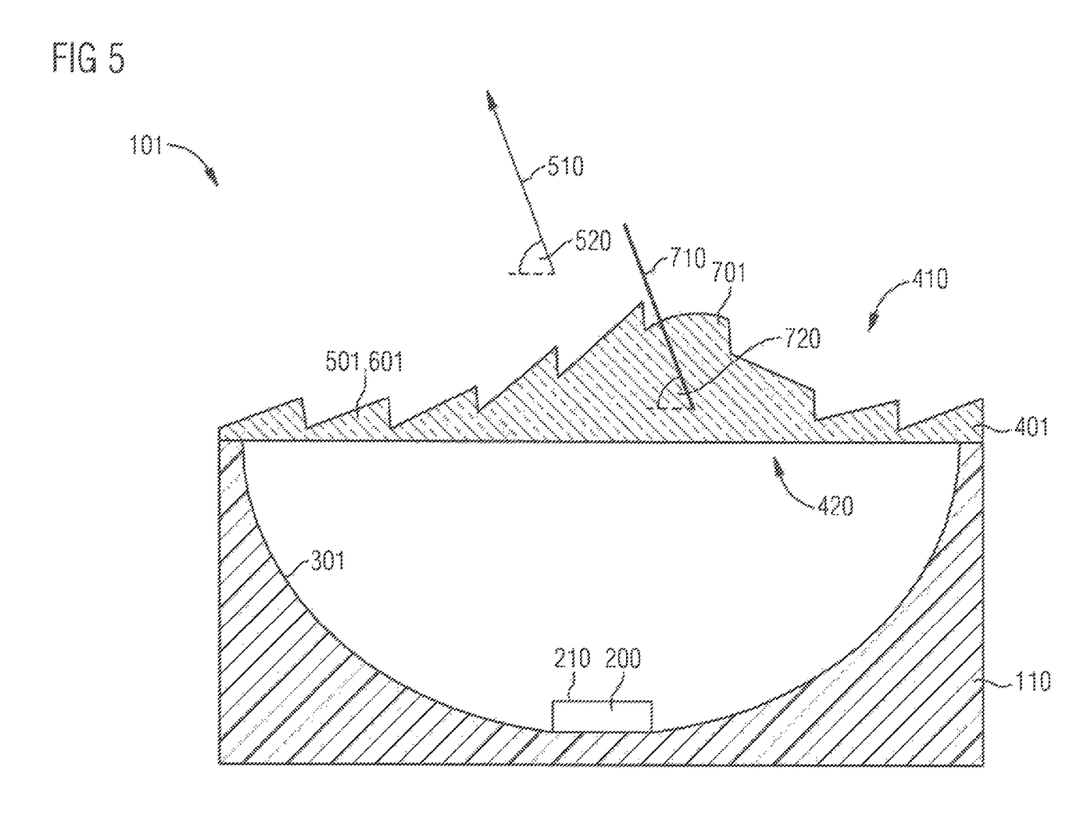
FIG. 5 shows a sectional side view of a second optoelectronic component.

FIG. 5 shows a schematic sectional side view of a second optoelectronic component 101. The second optoelectronic component 101 comprises a housing 110, which is configured like the housing 110 of the first optoelectronic component 100. A cavity of the housing 110 forms a second reflector 301, which is configured like the first reflector 300 of the first optoelectronic component 100. An optoelectronic semiconductor chip 200 comprising a radiation emission face 210 is arranged in the cavity, said optoelectronic semiconductor chip 200 being configured like the optoelectronic semiconductor chip 200 of the first optoelectronic component 100.

Instead of the first optical element 400, the second optoelectronic component 101 comprises a second optical element 401. The second optical element 401 comprises a top side 410 facing away from the radiation emission face 210 of the optoelectronic semiconductor chip 200 and an underside 410 facing the radiation emission face 210 of the optoelectronic semiconductor chip 200.

The second optical element 401 comprises a second prism structure 601, which forms a second deflection element 501. The second deflection element 501 is provided for deflecting electromagnetic radiation emitted by the optoelectronic semiconductor chip 200 in a main emission direction 510 which forms an angle 520 deviating from 90° with the radiation emission face 210 of the optoelectronic semiconductor chip 200. The main emission direction 510 in the case of the second component 101 is oriented as in the case of the first optoelectronic component 100.

Moreover, the second optical element 401 comprises a second optical lens 701 comprising an optical axis 710 which forms an angle 720 deviating from 90° with the radiation emission face 210 of the optoelectronic semiconductor chip 200. The optical axis 710 in the case of the second optoelectronic component 101 is oriented as in the case of the first optoelectronic component 100.

The second optical element 401 of the second optoelectronic component 101 differs from the first optical element 400 of the first optoelectronic component 100 in that both the second prism structure 601 forming the second deflection element 501 and the second optical lens 701 are arranged on the top side 410 of the first optical element 400.

In this case, the second prism structure 601 and the second optical lens 701 are superimposed on one another. This means that the second prism structure 601 arranged on the top side 410 of the second optical element 401 is deformed by the second optical lens 701 formed on the top side 410 of the second optical element 401.

The underside 420 of the second optical element 401 facing the radiation emission face 210 of the optoelectronic semiconductor chip 200 is configured in a planar fashion. However, it would likewise be possible to form both the second prism structure 601 forming the second deflection element 501, and the second optical lens 701 on the underside 420 of the second optical element 401. In this case, the top side 410 of the second optical element 401 can be configured in a planar fashion. A further possibility consists in arranging only the second optical lens 701 on the underside 420 of the second optical element 401, while the second prism structure 601 forming the second deflection element 501 is arranged on the top side 410 of the second optical element 401.

The irradiation intensity in an area illuminated by the second optoelectronic component 101 corresponds to the irradiation intensity in an area illuminated by the first optoelectronic component 100, as illustrated in the irradiation intensity diagram 900 in FIG. 4.

Figure 6:
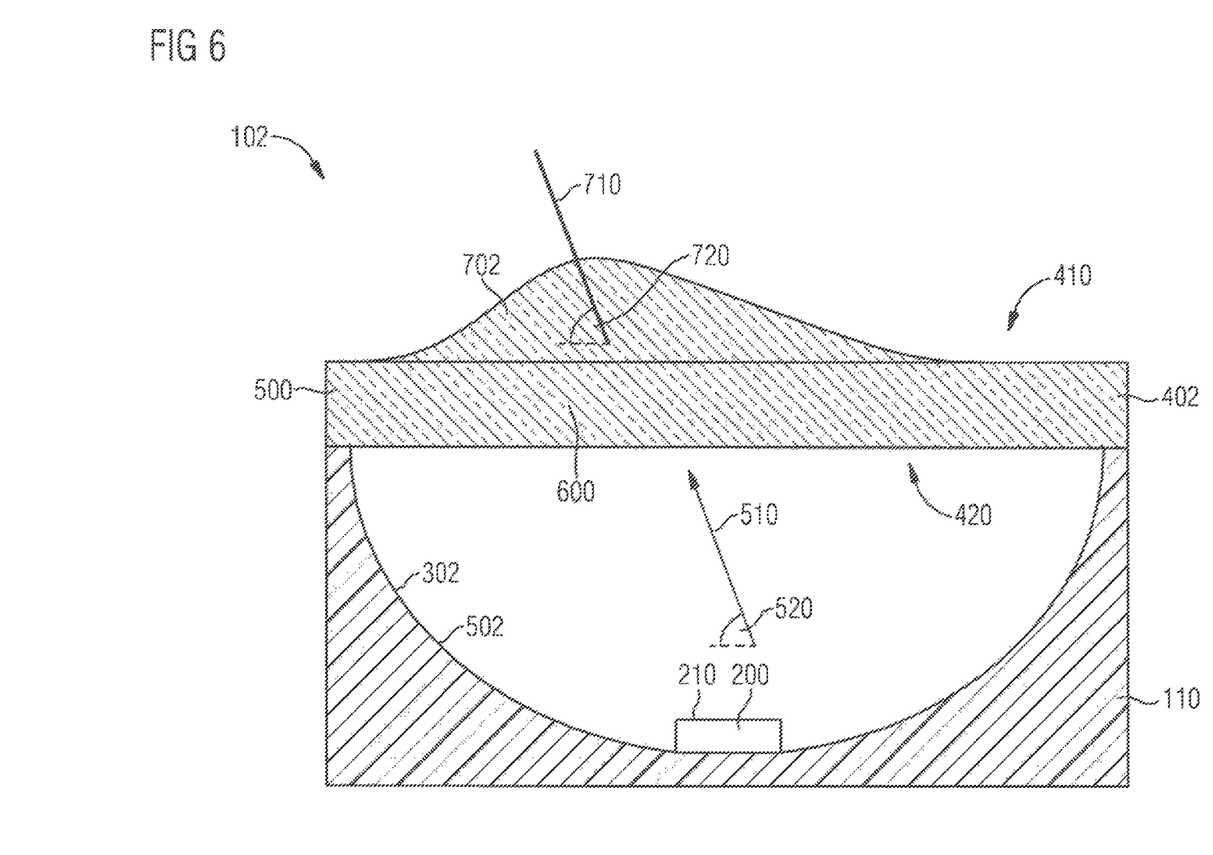
FIG. 6 shows a sectional side view of a third optoelectronic component.

FIG. 6 shows a schematic sectional side view of a third optoelectronic component 102. The third optoelectronic component 102 comprises a housing 110 comprising a cavity that forms a third reflector 302. An optoelectronic semiconductor chip 200 comprising a radiation emission face 210 is arranged in the cavity.

The third reflector 302 of the third optoelectronic component 102 differs from the first reflector 300 of the first optoelectronic component 100 in that the third reflector 302 is not rotationally symmetrical with respect to an axis of symmetry oriented perpendicularly to the radiation emission face 210 of the optoelectronic semiconductor chip 200. Instead, the third reflector 302 is configured asymmetrically with respect to an axis oriented perpendicularly to the radiation emission face 210, in such a way that the third reflector 302 brings about a deflection of electromagnetic radiation emitted by the optoelectronic semiconductor chip 200 in a main emission direction 510 which forms an angle 520 deviating from 90° with the radiation emission face 210 of the optoelectronic semiconductor chip 200. As a result, the third reflector 302 of the third optoelectronic component 102 acts as a third deflection element 502.

The third reflector 302 may be configured as a paraboloid of revolution or with a different rotationally symmetrical shape with an axis of symmetry oriented parallel to the main emission direction 510. However, the third reflector 302 may also comprise some other shape.

The third optoelectronic component 102 comprises a third optical element 402 instead of the first optical element 400. The third optical element 402 comprises a top side 410 and an underside 420 opposite the top side 410. The underside 420 of the third optical element 402 faces the radiation emission face 210 of the optoelectronic semiconductor chip 200.

The third optical element 402 differs from the first optical element 400 in that no prism structure is formed on the underside 420 of the third optical element 402. This is not necessary in the third optoelectronic component 102 since the third reflector 302 forms the third deflection element 502 in the third optoelectronic component 102.

A third optical lens 702 is arranged on the top side 410 of the third optical element 402, said third optical lens 702 being configured like the first optical lens 700 of the optical element 400 of the first optoelectronic component 100.

The irradiation intensity in an area illuminated by the third optoelectronic component 102 corresponds to the irradiation intensity in an area illuminated by the first optoelectronic component 100 as illustrated in the irradiation intensity diagram 900 in FIG. 4.

Figure 7:
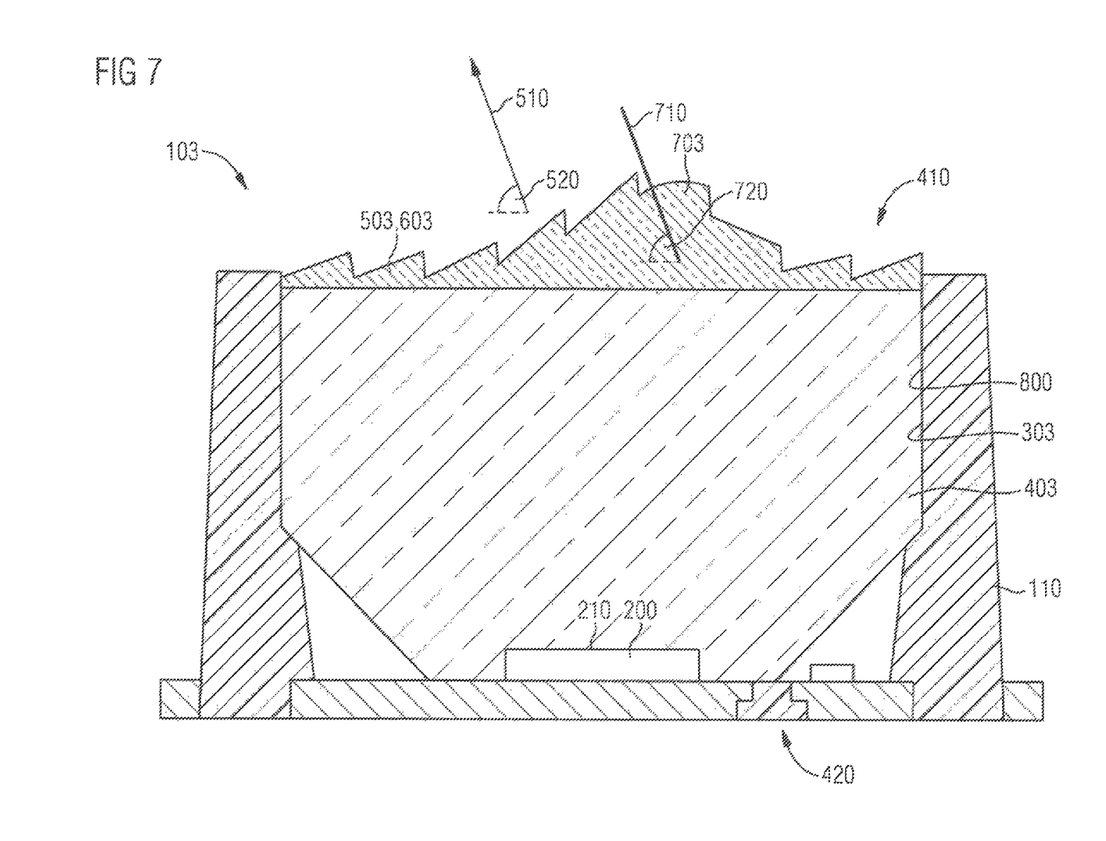
FIG. 7 shows a sectional side view of a fourth optoelectronic component.

FIG. 7 shows a schematic sectional side view of a fourth optoelectronic component 103. The fourth optoelectronic component 103 comprises a housing 110. The housing 110 comprises a cutout, in which an optoelectronic semiconductor chip 200 comprising a radiation emission face 210 is arranged. The optoelectronic semiconductor chip 200 of the fourth optoelectronic component 103 is configured like the optoelectronic semiconductor chip 200 of the first optoelectronic component 100.

Figure 8:
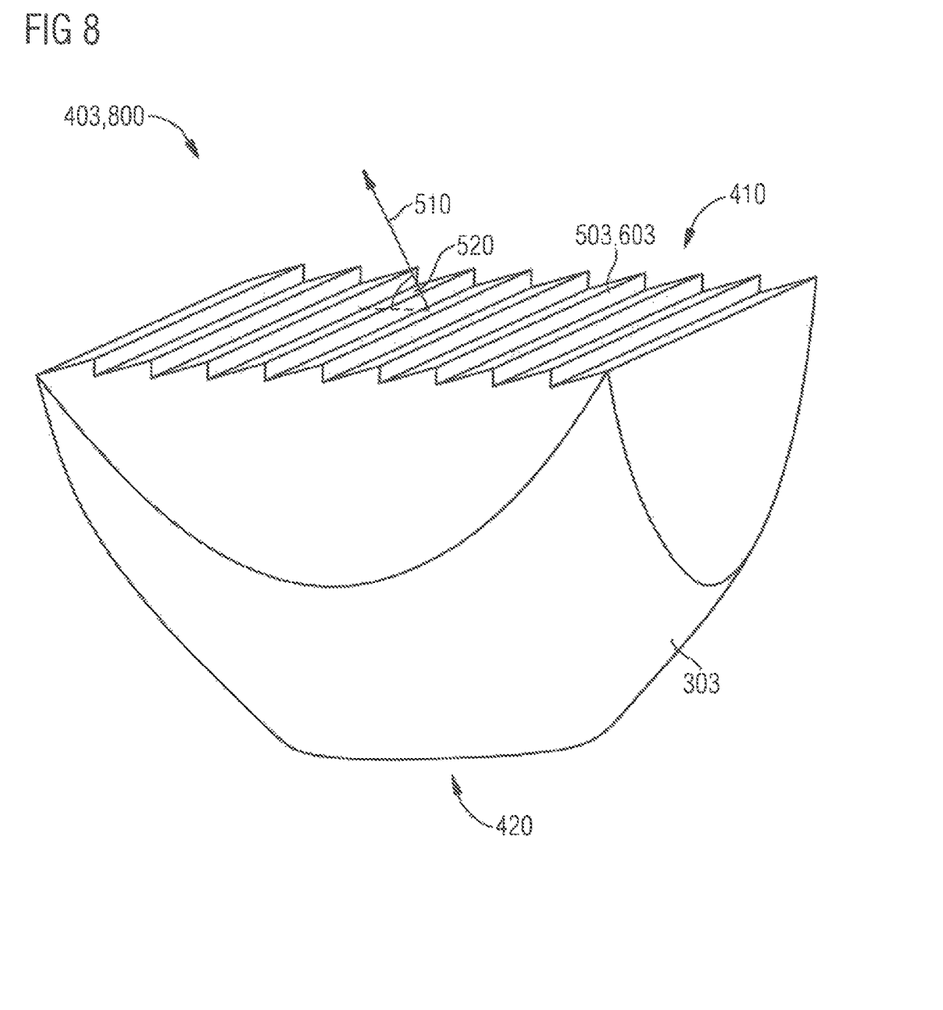
FIG. 8 shows a perspective view of a fourth optical element of the fourth optoelectronic component.

A fourth optical element 403 configured as a total internal reflection lens 800 is arranged above the radiation emission face 210 of the optoelectronic semiconductor chip 200 in the cutout of the housing 110 of the first optoelectronic component 100. FIG. 8 shows a simplified schematic perspective illustration of the fourth optical element 403 configured as a total internal reflection lens 800. The fourth optical element 403 comprises an optically transparent material, for example, a glass or an optically transparent plastic. The fourth optical element 403 comprises a top side 410 and an underside 420 opposite the top side 410. The underside 420 of the fourth optical elements 403 faces the radiation emission face 210 of the optoelectronic semiconductor chip 200.

A lateral surface of the fourth optical element 403 extending between the top side 410 and the underside 420 of the fourth optical element 403 forms a fourth reflector 303. Electromagnetic radiation propagating within the fourth optical element 403 may be subjected to total internal reflection at the lateral surface of the fourth optical element 403 forming the fourth reflector 303. As a result, the fourth reflector 303 collects electromagnetic radiation that is radiated into the fourth optical element 403 by the optoelectronic semiconductor chip 200 on the underside 420 of the fourth optical element 403. The electromagnetic radiation collected by the fourth reflector 303 may merge from the fourth optical element 403 at the top side 410 of the fourth optical element 403.

The medium surrounding the lateral surface of the fourth optical element 403, said lateral surface bringing about total internal reflection, comprises a lower reflective index than the fourth optical element 403 in order to enable the total internal reflection at the lateral surface forming the fourth reflector 303. For this purpose, by way of example, a sufficiently wide air gap may be provided between the lateral surface of the fourth optical element 403 and the housing 110.

The lateral surface of the fourth optical element 403 configured as a total internal reflection lens 800, said lateral surface forming the fourth reflector 303, and may be, at least in sections, radially symmetrical with respect to an axis of symmetry perpendicular to the radiation emission face 210. By way of example, the lateral surface of the fourth optical element 403 forming the fourth reflector 303 may be configured, at least in sections, as a paraboloid of revolution.

The top side 410 of the fourth optical element 403 of the fourth optoelectronic component 103 is configured like the top side 410 of the second optical element 401 of the second optoelectronic component 101. A fourth prism structure 603 is thus formed on the top side 410 of the fourth optical element 403, said fourth prism structure forming a fourth deflection element 503. Moreover, a fourth optical lens 703 is formed on the top side 410 of the fourth optical element 403, said fourth optical lens being superimposed on the fourth prism structure 603. The fourth optical lens 703 superimposed on the fourth prism structure 603 is not illustrated in FIG. 8, for the sake of clarity.

The fourth prism structure 603 forming the fourth deflection element 503 is configured like the second prism structure 601 of the second optical element 401 of the second optoelectronic component 101 and serves to deflect electromagnetic radiation emitted by the optoelectronic semiconductor chip 200 in a main emission direction 510 which forms an angle 520 deviating from 90° with the radiation emission face 210 of the optoelectronic semiconductor chip 200. The fourth optical lens 703 of the fourth optical element 403 is configured like the second optical lens 701 of the second optical element 401 and comprises an optical axis 710 which forms an angle 720 deviating from 90° with the radiation emission face 210 of the optoelectronic semiconductor chip 200.

The first optoelectronic component 100, the second optoelectronic component 101, the third optoelectronic component 102 and the fourth optoelectronic component 103 each comprise a deflection element 500, 501, 502, 503 configured to deflect electromagnetic radiation emitted by the respective optoelectronic semiconductor chip 200 in the main emission direction 510. In the case of the first optoelectronic component 100, the second optoelectronic component 101 and the fourth optoelectronic component 103, the deflection element 500, 501, 503 is formed in each case by a prism structure 600, 601, 603. In the case of the third optoelectronic component 102, the deflection element 502 is formed by the third reflector 302. It is possible to configure an optoelectronic component with a differently configured deflection element. By way of example, the deflection element may be formed by an arrangement of the optoelectronic semiconductor chip 200 in which the radiation emission face 210 of the optoelectronic semiconductor chip 200 is not oriented parallel to a mounting surface of the optoelectronic component. At any rate the optoelectronic component additionally comprises an optical lens 700, 701, 702, 703, the optical axis 710 of which forms an angle 720 deviating from 90° with the radiation emission face 210.

The invention has been illustrated and described in greater detail on the basis of the preferred exemplary embodiments. Nevertheless, the invention is not restricted to the examples disclosed. Rather, other variations may be derived therefrom by the person skilled in the art, without departing from the scope of protection of the invention.

The invention claimed is:

1. An optoelectronic component comprising:
   an optoelectronic semiconductor chip comprising a radiation emission face;
   a deflection element configured to deflect electromagnetic radiation emitted by the optoelectronic semiconductor chip in a main emission direction which forms an angle deviating from 90° with the radiation emission face, wherein the deflection element is configured as a prism structure; and
   an optical lens having an optical axis, wherein the optical axis forms an angle deviating from 90° with the radiation emission face.

2. The optoelectronic component according to claim 1, wherein the optical lens is configured as a converging lens.

3. The optoelectronic component according to claim 1, wherein the optical lens is configured in a non-radially symmetrical fashion.

4. The optoelectronic component according to claim 3, wherein the optical lens comprises a shape of an ellipse in a plane parallel to the radiation emission face.

5. The optoelectronic component according to claim 4, wherein the optical axis of the optical lens and a major axis of the ellipse are arranged in a common plane.

6. The optoelectronic component according to claim 1, wherein the main emission direction and the optical axis of the optical lens are arranged in a common plane.

7. The optoelectronic component according to claim 6, wherein the main emission direction and the optical axis are tilted in the same direction relative to a direction perpendicular to the radiation emission face.

8. The optoelectronic component according to claim 1, wherein the optical lens and the prism structure are formed on a common optical element.

9. The optoelectronic component according to claim 8, wherein the prism structure and the optical lens are superimposed on one another.

10. The optoelectronic component according to claim 9, wherein the optical element is configured as a total internal reflection lens.

11. The optoelectronic component according to claim 8, wherein the prism structure and the optical lens are located on opposite sides of the optical element.

12. The optoelectronic component according to claim 8, wherein the prism structure is arranged on a side of the optical element that faces the radiation emission face.

13. The optoelectronic component according to claim 8, wherein the prism structure is arranged on a side of the optical element that faces away from the radiation emission face.

14. The optoelectronic component according to claim 1, wherein the deflection element is configured as a reflector.

* * * * *